(12) United States Patent
Kanamaru et al.

(10) Patent No.: US 6,563,684 B2
(45) Date of Patent: *May 13, 2003

(54) METHOD OF MANUFACTURING EXCESS CURRENT INTERRUPTING STRUCTURE

(75) Inventors: Naoyuki Kanamaru, Shimogyo-ku (JP); Naoki Motoyama, Shimogyo-ku (JP); Yoshinori Watajima, Shimogyo-ku (JP); Takashi Fujimoto, Shimogyo-ku (JP); Tetsuya Sawamura, Shimogyo-ku (JP); Nobutamo Matsunaga, Shimogyo-ku (JP); Kazutaka Yoshida, Shimogyo-ku (JP); Shuichi Sugimoto, Shimogyo-ku (JP); Hoshihisa Toki, Shimogyo-ku (JP)

(73) Assignee: Omron Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/985,842

(22) Filed: Nov. 6, 2001

(65) Prior Publication Data

US 2002/0036880 A1 Mar. 28, 2002

Related U.S. Application Data

(62) Division of application No. 09/324,477, filed on Jun. 2, 1999.

(30) Foreign Application Priority Data

Jun. 2, 1998 (JP) .......................................... 10-169225

(51) Int. Cl.[7] ................................................. H02H 5/00
(52) U.S. Cl. .......................... 361/103; 361/58; 361/104
(58) Field of Search ................................. 361/104, 100, 361/58, 93.1, 103

(56) References Cited

U.S. PATENT DOCUMENTS

| 2,302,820 | A | | 11/1942 | Van Liempt |
| 3,818,408 | A | | 6/1974 | Andersson |
| 4,547,830 | A | | 10/1985 | Yamauchi .................... 361/104 |
| 4,862,134 | A | | 8/1989 | Poerschke et al. .......... 337/231 |
| 5,572,181 | A | | 11/1996 | Kiryu et al. ................. 337/273 |
| 5,583,740 | A | | 12/1996 | Fujino |
| 5,644,281 | A | | 7/1997 | Kuriyama .................... 337/295 |
| 5,858,454 | A | | 1/1999 | Kiru et al. ................... 427/118 |
| 6,462,925 | B2 | * | 10/2002 | Kanamuru et al. ......... 361/93.8 |

FOREIGN PATENT DOCUMENTS

| DE | 296 16 063 | 12/1996 |
| EP | 0 364 981 | 4/1990 |
| JP | SHO 34-20549 | 12/1956 |
| JP | SHO 56-43165 | 4/1981 |
| JP | 6-5089 | 1/1994 |
| JP | 07-057616 | 3/1995 |
| JP | 10-125213 | 5/1998 |
| JP | 10-134695 | 5/1998 |

* cited by examiner

Primary Examiner—Stephen W. Jackson
(74) Attorney, Agent, or Firm—Morrison & Foerster LLP

(57) ABSTRACT

An excess current interrupting structure comprising a conductive wire rod which generates heat by an excess current connected between a pair of electric conductors, a circumference of the conductive wire rod being covered with a resin with a thin coated layer formed in the vicinity of a path of the conductive wire rod.

12 Claims, 13 Drawing Sheets

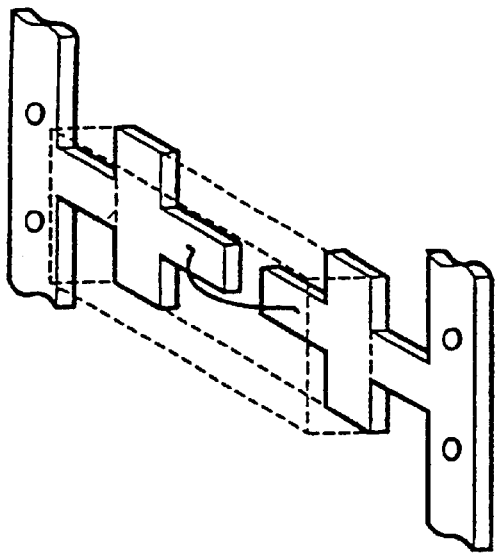
FIG.9(a) ELECTRODE PIECE FORMATION STAGE
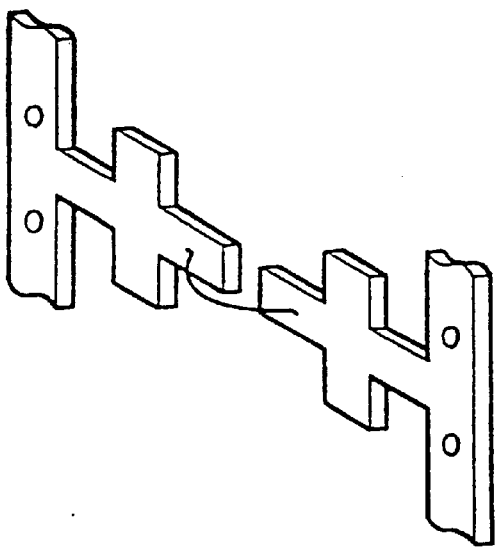
FIG.9(b) WIRE BONDING STAGE
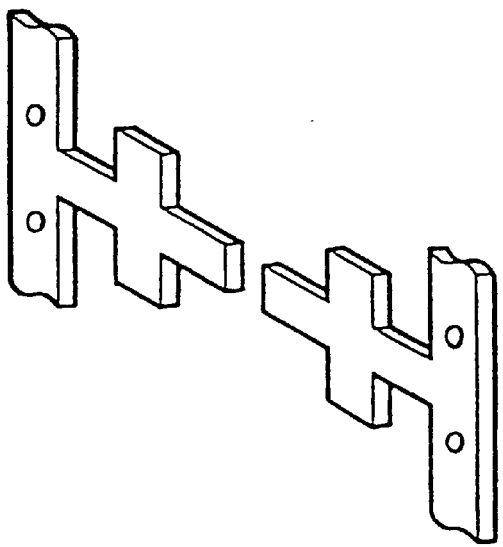
FIG.9(c) RESIN MOLDING STAGE
FLOW OF PRODUCTION LINE

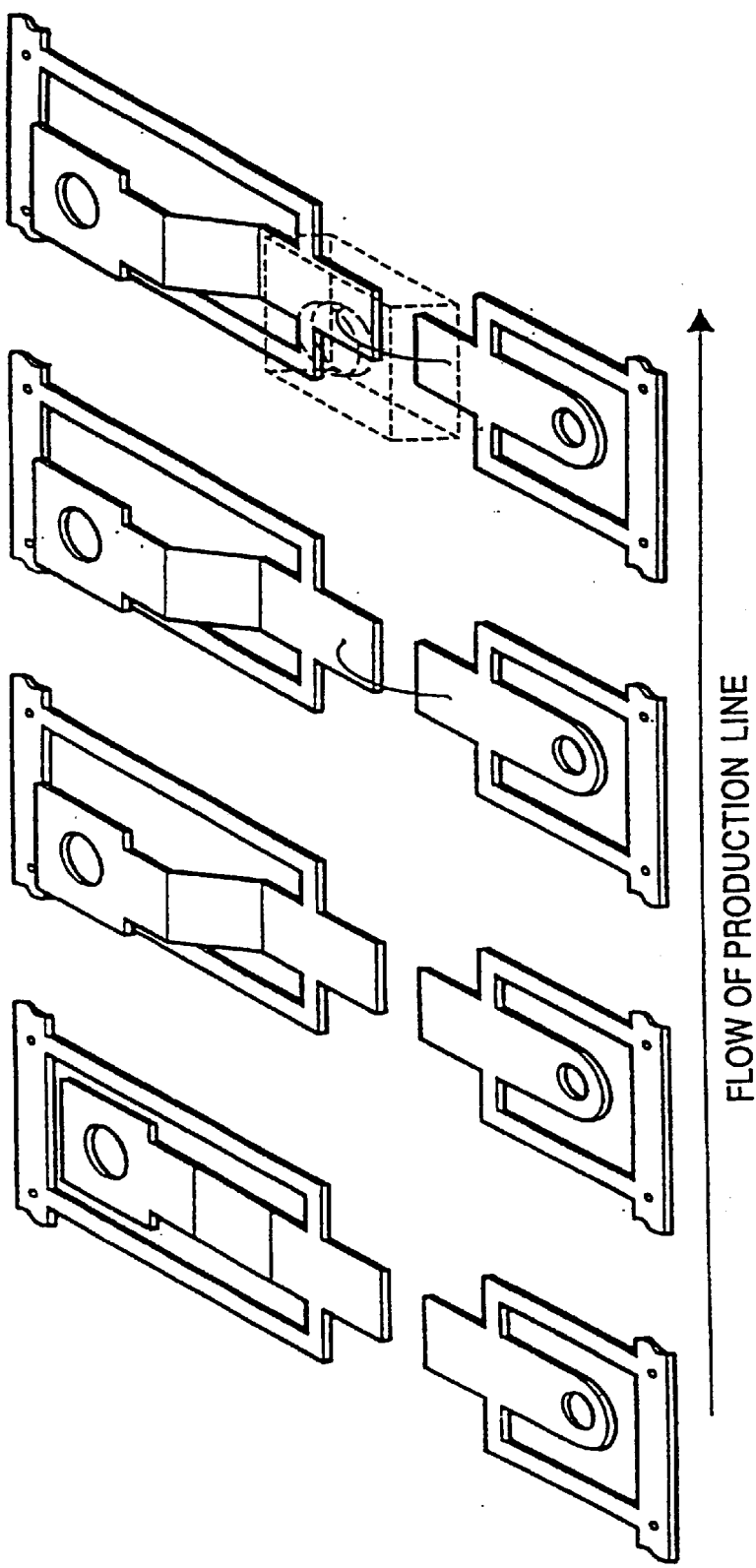

PRIOR ART

METHOD OF MANUFACTURING EXCESS CURRENT INTERRUPTING STRUCTURE

BACKGROUND OF THE INVENTION

1. Field of the Invention

The present invention relates to an excess current interrupting structure capable of shutting off an electric current path, which is connected to a load, with a high responsibility and a high reliability when the current path is put in the condition in which an excess current flows therein, and more particularly to an excess current interrupting structure which is formed by using as a conductive wire rod generating heat by an excess current a wire rod, for example, a fine gold wire, a copper wire and an aluminum wire in which good conductors including gold, copper and aluminum are rendered capable of being handled as wire rods of a relatively high resistance; and covering a circumference of this conductive wire rod with a resin, and which is adapted to enable the electric current path in which an excess current flows to be completely shut off.

2. Description of the Related Art

In a related electric current path connected to a load, a fuse is inserted, and, when the current path is put in the condition in which an excess current flows therein, the fuse is melted to shut off the electric current path. As known well, this fuse employs a structure of a cartridge fuse 101 shown in FIG. 16 in, for example, a load power source line in which an accident current is large, so as to protect a fuse wire rod, and a structure of a tubular fuse 102 shown in FIG. 17 in an electronic machine and tool in which an accident current is small, so as to protect the machine and tool. However, these fuses have the following problems.

(1) The cartridge fuse 101 has a complicated construction, a high degree of difficulty in manufacturing and a high price, so that it causes a large cost increase in the overload protection in a load power source line.

(2) Both the cartridge fuse 101 and the tubular cartridge 102 use a fuse holder, so that, when they are contained in a machine and a tool, a space occupied thereby increases.

Repeated discussions and experiments on an excess current interrupting structure superseding the fuses which have such problems come to propose a new excess current interrupting structure. This new excess current interrupting structure uses as a core a conductive wire rod, which generates heat by an excess current, such as, for example, a fine gold wire and a fine copper wire in which good conductors including gold, copper and aluminum are rendered capable of being handled as wire rods of a relatively high resistance, and is thereby formed into a structure in which a circumference of this conductive wire rod is coated with a resin. Therefore, the securing of the capacity of an electric current path (heat radiation to the surrounding of the path) and the fixing of a pair of electric conductors (for example, terminals) connected together by a conductive wire rod can be attained. In addition, this structure is advantageous in view of its easiness in handling, resistance to environment and insulating characteristics with respect to peripheral parts.

However, in the case of a structure in which a circumference of a conductive wire rod is coated with a resin, it should be noted that the carbonization of the resin around the conductive wire rod progresses in a stage in which the conductive wire rod comes to be melted by an excess current with this carbonized portion constituting a bypass electric current path (carbonized path). Namely, even when the conductive wire rod is melted by an excess current, the bypass electric current path formed of the carbonized portion remains, and an excess current necessarily continues to be supplied to the load. Therefore, a related structure in which a circumference of a conductive wire rod is coated with a resin lacks practicability.

SUMMARY OF THE INVENTION

The present invention has been effected with attention paid to the above-mentioned problems of the related art, and aims at providing a practical excess current interrupting structure, in which a circumference of a conductive wire rod is coated with a resin, capable of shutting off with a high responsibility and a high reliability an electric current path in which an excess current flows.

An object of this invention is to provide an excess current interrupting structure comprising a conductive wire rod which generates heat by an excess current connected between a pair of electric conductors, a circumference of the conductive wire rod being covered with a resin with a thin coated layer of the covering formed in the vicinity of a path of the conductive wire rod.

In the invention, when the conductive wire rod connected between a pair of electric conductors generates heat by an excess current to cause the temperature thereof to increase with the resin layer also generating heat at the same time to cause the temperature thereof to increase, the temperature rise in the resin layer is concentrated in the section thereof in which the thin coated portion is formed. In consequence, thermal stress and a large quantity of gas occur in a stage of carbonization of the resin in the section of the resin layer in which the thin coated portion is formed rather than in the section thereof which remains to have a thickness of the resin layer. In other words, an increase in thermal stress and a gas pressure in the section of the resin layer in which the thin coated portion is formed becomes sharper than that of the thermal stress and the gas pressure in the section thereof which remain to have a thickness of the resin layer.

Therefore, when thermal stress and a gas pressure are in the condition far from that in which the thermal stress and the gas pressure becomes a critical bursting pressure in the section which remains to have a thickness of the resin layer in a stage in which a carbonized path is formed ascribed to the carbonization of the resin around the conductive wire rod caused by a flow of an excess current through the conductive wire rod, thermal stress and a gas pressure in the section in which the thin coated portion is formed reach a critical bursting pressure, and the section bursts on a small scale. Consequently, the section in which the thin coated portion is formed is momentarily destroyed with the carbonized path as if cracks occurred in a fault, no matter whether the conductive wire rod is melted by an excess current or not. As a result, when a load current flowing in the current path between a pair of electric conductors has become an excess current, the current path in the section in which the thin coated portion is formed will be able to be shut off with a high responsibility and a high reliability owing to the non-destroyed condition of the section which remains to have a thickness of the resin layer. In addition, when the thickness of the thin coated layer of covering is regulated, a degree of freedom of design to finely regulate the shut-off time for the current path will be obtained.

In a first sub-aspect the excess current interrupting structure according to the invention, the conductive wire rod is a conductor wire of a reduced diameter comprising a metal of a high electric conductivity.

In the above first sub-aspect, a degree of freedom of design to arrange a conductive wire rod generating heat by an excess current will be obtained.

In a second sub-aspect of the excess current interrupting structure according to the invention, the conductive wire rod is plurally connected between the pair of electric conductors.

In the above second sub-aspect, it will be possible to expand a heat source region occurring when an excess current flows between the pair of electric conductors, and expand a destruction starting point. This can be effected by reducing the diameter of the electric wire rod in inverse proportion to the number thereof.

In a third sub-aspect of the excess current interrupting structure according to the invention, the pair of electric conductors are formed based on a material and volume thereof selected so that the generation of heat by an excess current is concentrated on the conductive wire rod.

In the above third sub-aspect, the conductive wire rod will generate heat with a high responsibility when an excess current flows in the current path.

In a fourth sub-aspect of the excess current interrupting structure according to the invention, the pair of electric conductors are of a shape according to surface mounting specifications.

In the above fourth sub-aspect, the electric conductors will be able to be mounted easily on a circuit board by utilizing a surface mounting technique.

In the fifth sub-aspect of the excess current interrupting structure according to the invention, the thin coated layer of covering is formed by a transfer mold using a metal mold.

In the above fifth sub-aspect, the thin coated layer of covering is formed when the conductive wire rod connected between the electric conductors is formed by a transfer mold using a metal mold, so that a production process will be simplified.

In a sixth sub-aspect of the excess current interrupting structure according to the invention, the thin coated layer of covering is provided therein with an abnormality detecting means, such as a temperature sensing substance and a physical force sensing substance.

In the above sixth sub-aspect, when the thermal destruction of the thin coated layer of covering cannot be recognized visually from the outside, the occurrence thereof will be able to be known by a change in a color tone based on the temperature sensed by the temperature sensing substance.

BRIEF DESCRIPTION OF THE DRAWINGS

FIG. 9 is a drawing describing manufacturing stages for obtaining the construction of the second mode of embodiment of the excess current interrupting structure according to the invention.

FIG. 11 is a drawing describing manufacturing stages for obtaining the construction of the third mode of embodiment of the excess current interrupting structure according to the invention.

DESCRIPTION OF THE PREFERRED EMBODIMENTS

Preferred modes of embodiments of the invention will now be described on the basis of the drawings.

Figure 1:
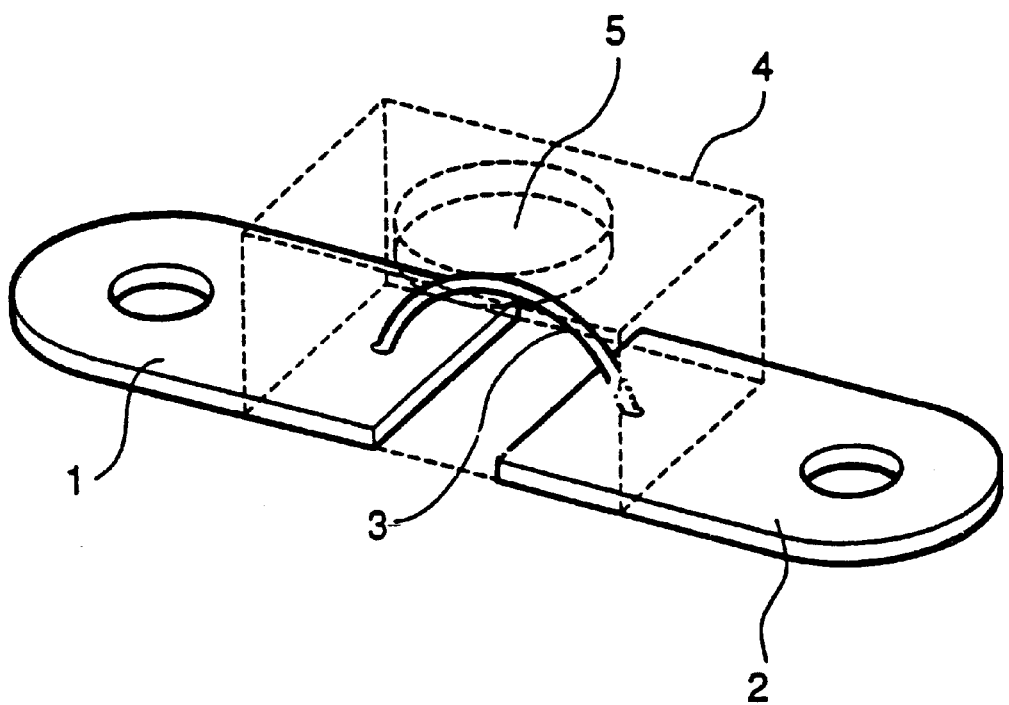
FIG. 1 is a schematic perspective view showing the construction of a first mode of embodiment of the excess current interrupting structure according to the invention.

The schematic perspective view of FIG. 1 shows the construction of a first mode of embodiment of the excess current interrupting structure according to the invention. Referring to the drawing, 1 and 2 denote electrode pieces of a terminal structure which constitute a pair of electric conductors, and 3 denotes a conductor wire of a very small diameter comprising a metal of a high electric conductivity, such as, for example, gold, copper and aluminum, formed to a relatively high resistance and adapted to generate heat by an excess current. In this mode of embodiment, a diameter of the conductor wire applied thereto was set to 50 microns when a gold wire was used, and to 300 microns when an aluminum wire was used. Also, 4 denotes a resin layer, and 5 a thin coated layer of covering.

In the excess current interrupting structure of this mode of embodiment, the conductor wire 3 generating heat by an excess current is connected between a pair of electrode pieces 1, 2 by wire bonding, and the resin layer 4 is then formed by coating in a sealed state a circumference of the conductor wire 3 with a molding resin, such as, for example, an epoxy resin by a transfer mold using a metal mold. When the resin layer 4 is formed, the thin coated layer of covering 5 is formed at the same time by circularly recessing the portion in the vicinity of a path of the conductor wire 3. A recessing depth for forming the thin coated layer of covering 5 is a depth at which the conductor wire 3 is not exposed, and, concretely speaking, this depth is set so that a size of a portion between an outer surface of the thin coated layer of covering 5 and a top portion of the conductor wire 3 becomes around 0.5 mm.

A material the kind of which is selected, and the magnitude of the mass of which is selected, so as to reduce the conductor resistance thereof and increase the thermal capacity thereof is used as the pair of electrode pieces 1, 2 so that, when an excess current flows between the pair of electrode pieces 1, 2, the generation of heat is concentrated in the conductor wire 3. Accordingly, the conductor wire 3 generates heat at this time with a high responsibility.

When the conductor wire 3 connected between the electrode terminal pieces 1, 2 generates heat to increase the temperature thereof owing to the employment of such a structure in which the thin coated layer of covering 5 is formed by recessing the portion in the vicinity of the path of the conductor wire 3 in which the generation of heat is concentrated when an excess current flows therein, the generation of heat in the resin layer 4 due to this temperature rise is concentrated in the thin coated layer of covering 5. During this time, thermal stress and a large quantity of gas occur in a stage of carbonization of the resin in a portion of the resin layer 4, especially, the portion thereof in which the thin coated layer of covering 5 is formed.

Therefore, when thermal stress and a gas pressure are in the condition far from that in which thermal stress and the gas pressure become a critical bursting pressure in the section which remains to have a thickness of the resin layer 4 in a stage in which a carbonized path is formed ascribed to the carbonization of the resin around the conductor wire 3 caused by a flow of an excess current through the conductor wire, thermal stress and a gas pressure in the section in which the thin coated portion of covering 5 is formed reach a critical bursting pressure, and the section bursts on a small scale. Consequently, the section in which the thin coated portion 5 is formed is momentarily destroyed with the carbonized path as if cracks occurred in a fault, no matter whether the conductive wire rod is melted by an excess current or not. As a result, when a load current flowing in the current path between the pair of electric conductors has become an excess current, the current path in the section in which the thin coated thickness portion of covering is formed can be shut off with a high responsibility and a high reliability owing to the non-destroyed condition of the section which remains to have a thickness of the resin layer 4. In addition, the advantages given below arise.

(1) A degree of freedom of design to finely regulate the shut-off time for the current path is obtained by regulating the thickness of the thin coated layer of covering 5.

(2) A degree of freedom of design to connect and arrange the conductive wire rod which generates heat by an excess current.

(3) The resin layer is advantageous in view of the easiness in handling, resistance to environment, and insulating characteristics with respect to peripheral parts.

(4) Since the resin layer 4 including the thin coated layer of covering 5 is formed when the conductive wire rod connected between the electric conductors is formed by a transfer mold using a metal mold, a production process is simplified. Since the excess current interrupting structure can be manufactured by utilizing a general semiconductor package production line, the capacity of manufacturing the same can be improved, and a decrease in cost can be effected.

When the shape of the thin coated layer of covering 5 in the structure of this mode of embodiment is devised variously as in the embodiments shown in FIGS. 2–7, the responsibility with which the section, in which the thin coated layer of covering 5 is formed, is destroyed due to the generation of heat in the conductor wire 3 by an excess current is promoted.

Figure 2A:
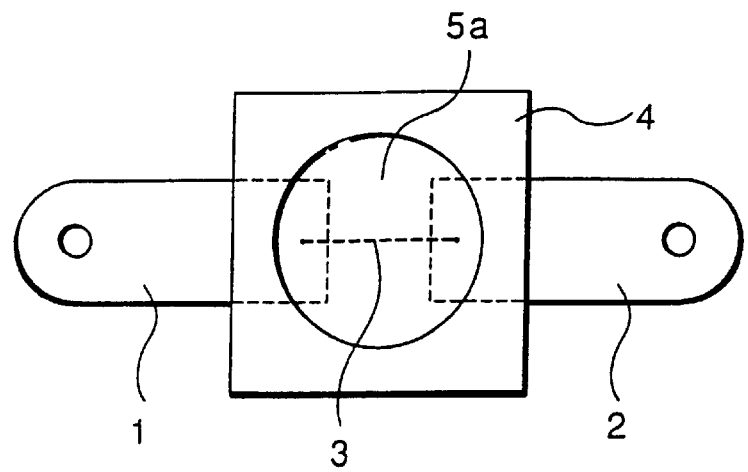
FIG. 2 is a drawing describing the construction of a first embodiment formed by adding an idea to the construction of the first mode of embodiment of the excess current interrupting structure according to the invention.
Figure 2B:
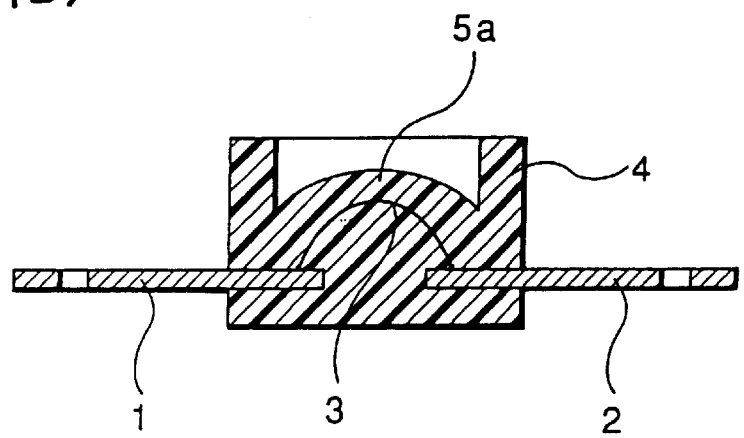

In the embodiment shown in a top view of FIG. 2(*a*) and a sectional view of FIG. 2(*b*), a thin coated layer of covering 5*a* an outer surface of which is bent in conformity with the shape of a bonded conductor wire 3 is formed in a resin layer 4. In this case, cracks are liable to occur in the direction which crosses the conductor wire 3, when an excess current flows therein, and the responsibility with which a section, in which the thin coated layer of covering 5*a* is formed, is destroyed is promoted.

Figure 3:
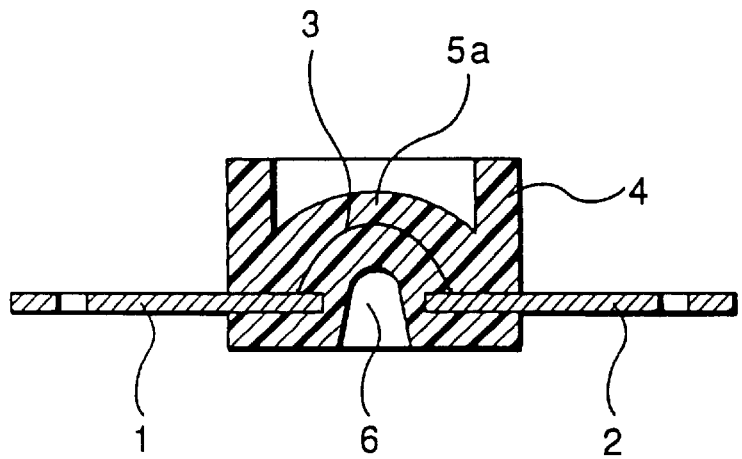
FIG. 3 is a drawing describing the construction of a modified example of the first embodiment formed by adding an idea to the construction of the first mode of embodiment of the excess current interrupting structure according to the invention.

The embodiment shown in a sectional view of FIG. 3 is a modified example of the embodiment shown in FIG. 2, in which a recess 6 reducing the thickness of a resin cover for a conductor wire 3 is formed in a bottom surface in a position in which a thin coated layer of covering 5*a* is formed. In this case, cracks are liable to occur more in the direction crossing the conductor wire 3, when an excess current flows therein, and the responsibility with which a section, in which the thin coated layer of covering 5*a* is formed, is destroyed is promoted.

Figure 4A:
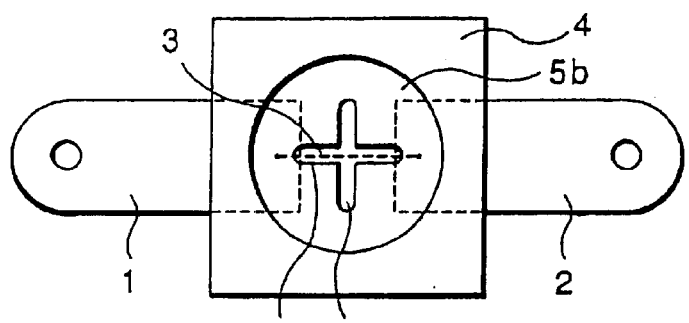
FIG. 4 is a drawing describing the construction of a second embodiment formed by adding an idea to the construction of the first mode of embodiment of the excess current interrupting structure according to the invention.
Figure 4B:
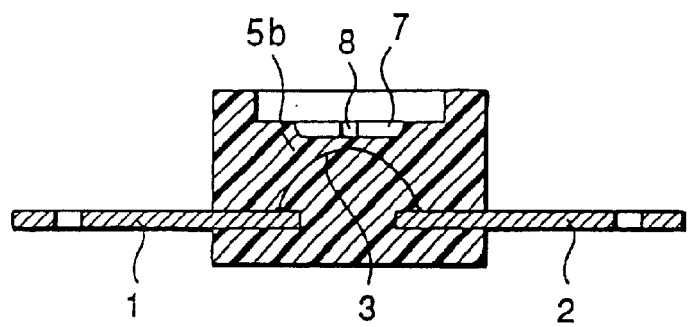

In the embodiment shown in a top view of FIG. 4(*a*) and a sectional view of FIG. 4(*b*), a grooved thin coated layer of covering 5*b* an outer surface of which has therein a groove 7 extending along the axis of a conductor wire 3 and a groove 8 extending so as to cross the above groove are formed in a resin layer 4. In this case, the grooves 7, 8 constitute constructional drawbacks when an excess current flows, and cracks are liable to occur, so that a responsibility at which a section, in which the thin coated layer of covering 5*b* is formed, is destroyed is promoted.

Figure 5A:
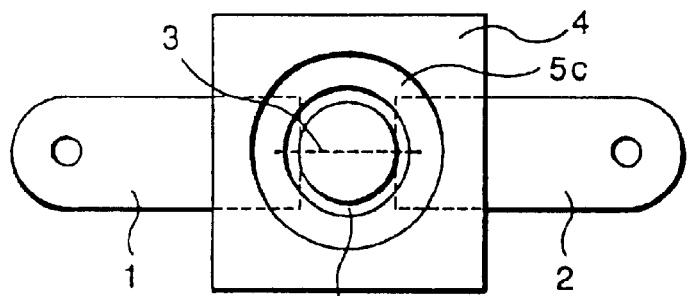
FIG. 5 is a drawing describing the construction of a third embodiment formed by adding an idea to the construction of the first mode of embodiment of the excess current interrupting structure according to the invention.
Figure 5B:
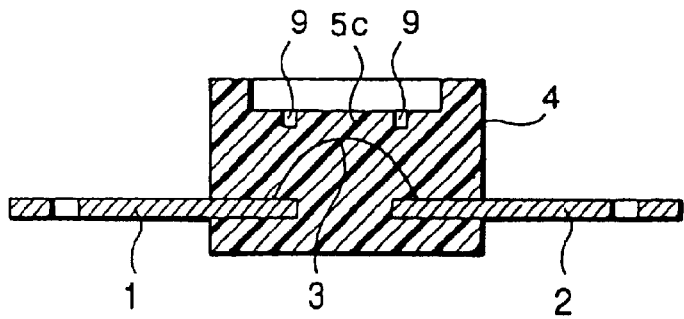

In the embodiment shown in a top view of FIG. 5(*a*) and a sectional view of FIG. 5(*b*), a grooved thin coated layer of covering 5*c* an outer surface of which has a groove 9 made circularly with a central point of the axis of a conductor wire 3 as its center is formed in a resin layer 4. In this case, the groove 9 constitutes a constructional drawback when an excess current flows, and cracks become liable to occur, so that a responsibility with which a section, in which the thin coated layer of covering 5*c* is formed, is destroyed is promoted.

Figure 6A:
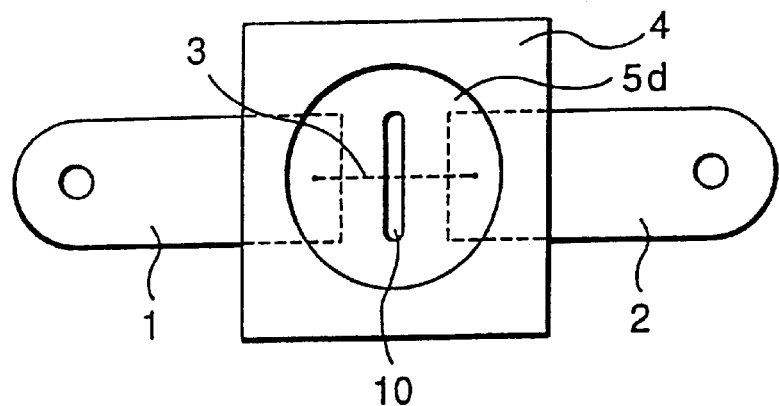
FIG. 6 is a drawing describing the construction of a fourth embodiment formed by adding an idea to the construction of the first mode of embodiment of the excess current interrupting structure according to the invention.
Figure 6B:
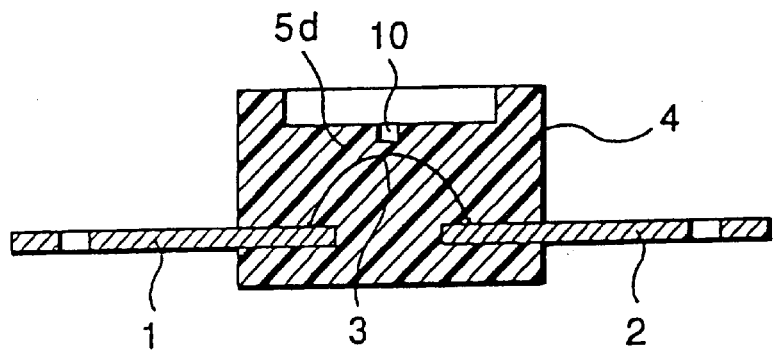
Figure 7:
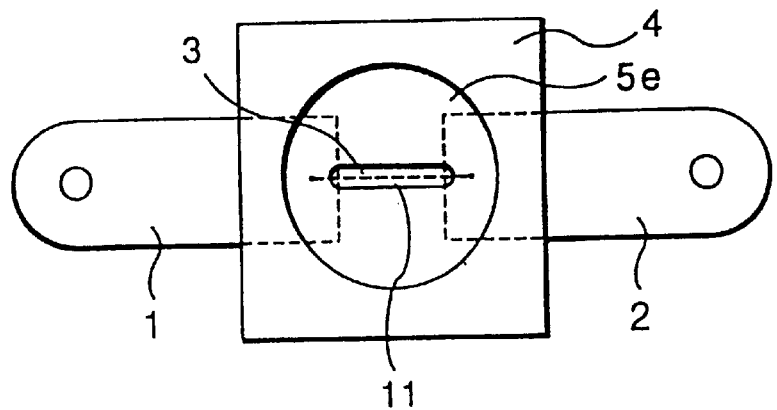
FIG. 7 is a drawing describing the construction of a modified example the fourth embodiment formed by adding an idea to the construction of the first mode of embodiment of the excess current interrupting structure according to the invention.

In the embodiment shown in a top view of FIG. 6(*a*) and a sectional view of FIG. 6(*b*), a thin coated layer of covering 5*d* an outer surface of which has a groove 10 made so as to extend in a direction crossing a central point on the axis of a conductor wire 3 is formed in a resin layer 4. In this case, the groove 10 constitutes a constructional drawback when an excess current flows, and cracks become liable to occur, so that a responsibility with which a section, in which the thin coated layer of covering 5*d* is formed, is destroyed is promoted. As shown in a top view of FIG. 7, the destruction of a thin coated layer of covering 5*e* may be promoted by forming a groove 11 which extends in a direction aligning the axis of a conductor wire 3.

Figure 8:
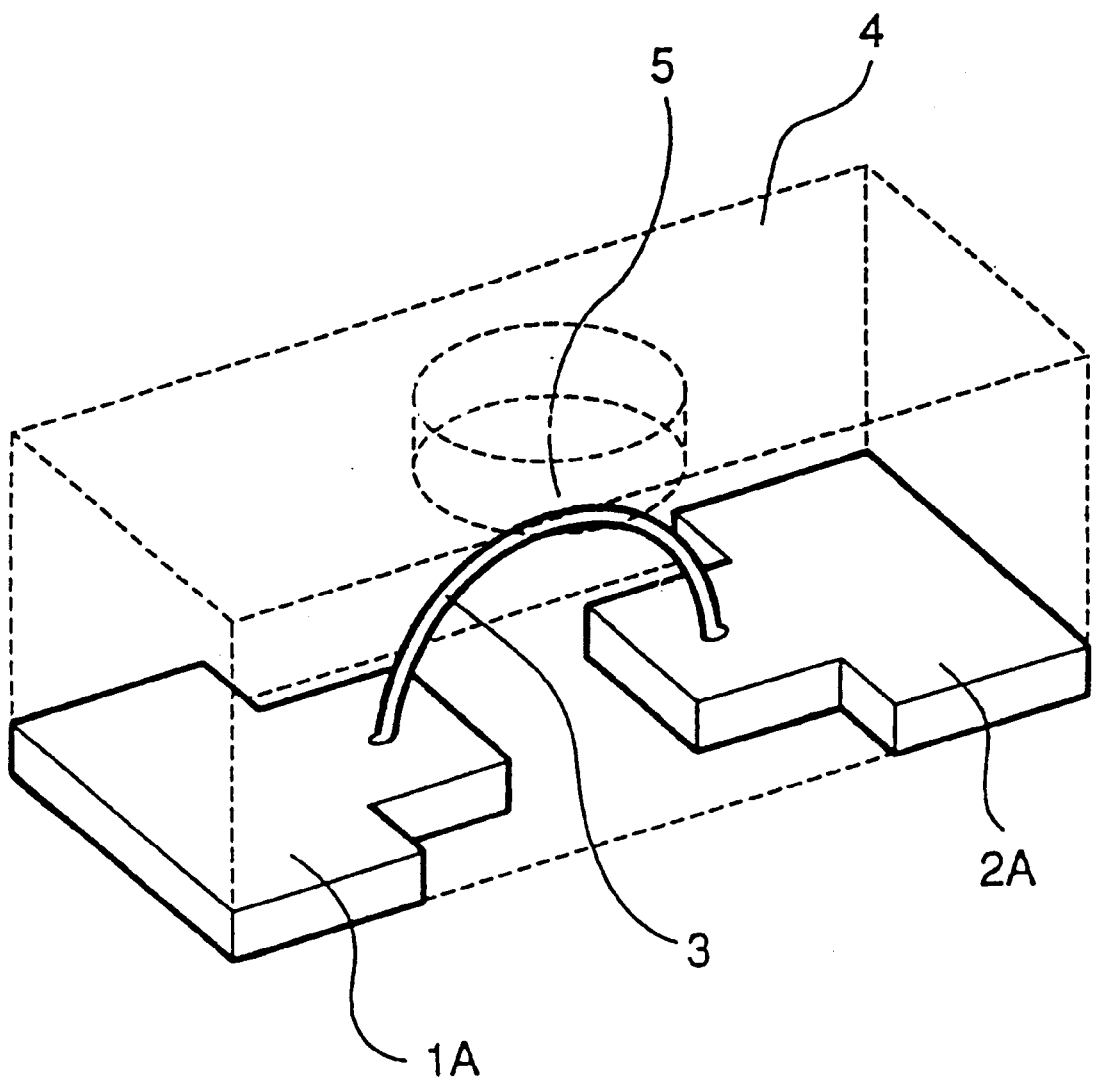
FIG. 8 is a schematic perspective view showing the construction of the second mode of embodiment of the excess current interrupting structure according to the invention.

A schematic perspective view of FIG. 8 shows the construction of a second mode of embodiment of the excess current interrupting structure according to the present vention. In this mode of embodiment, electrode pieces 1A, 2A of SMD specifications are used as a pair of electric conductors as shown in the same drawing, and a conductor wire 3 is connected between the pair of electrode pieces 1A, 2A by wire bonding, these parts being then resin-sealed to form an excess current interrupting structure functioning in accordance with the above-mentioned first mode of embodiment.

Even in the excess current interrupting structure of this mode of embodiment, a thin coated layer of covering 5 is formed at the same time in a section in the vicinity of a path of the conductor wire 3 when the resin layer 4 is formed, so that the section in which the thin coated layer of covering 5 is formed is momentarily destroyed with a carbonized path as if cracks occurred in a fault, owing to thermal stress and a gas occurring due to an excess current flowing in the conductor wire 3 no matter whether the conductor wire 3 connected between the pair of electrode terminal pieces 1A, 2A is melted by the excess current or not. Therefore, effects identical with those of the first mode of embodiment are obtained. In addition, this structure can be mounted easily on a conductor pattern by utilizing a surface mounting technique.

In order to manufacture the excess current interrupting structure of this mode of embodiment sequently carried out are, an electrode piece formation stage (1), a wire bonding stage (2), and a resin molding stage (3), which are set by arranging the same from an upstream side of a production line toward a downstream side thereof with respect to a lead frame 12 as shown in FIG. 9, are carried out in order, and, after the resin molding stage (3) has been finished, frame cutting is done to obtain an excess current interrupting structure of FIG. 8.

Figure 10:
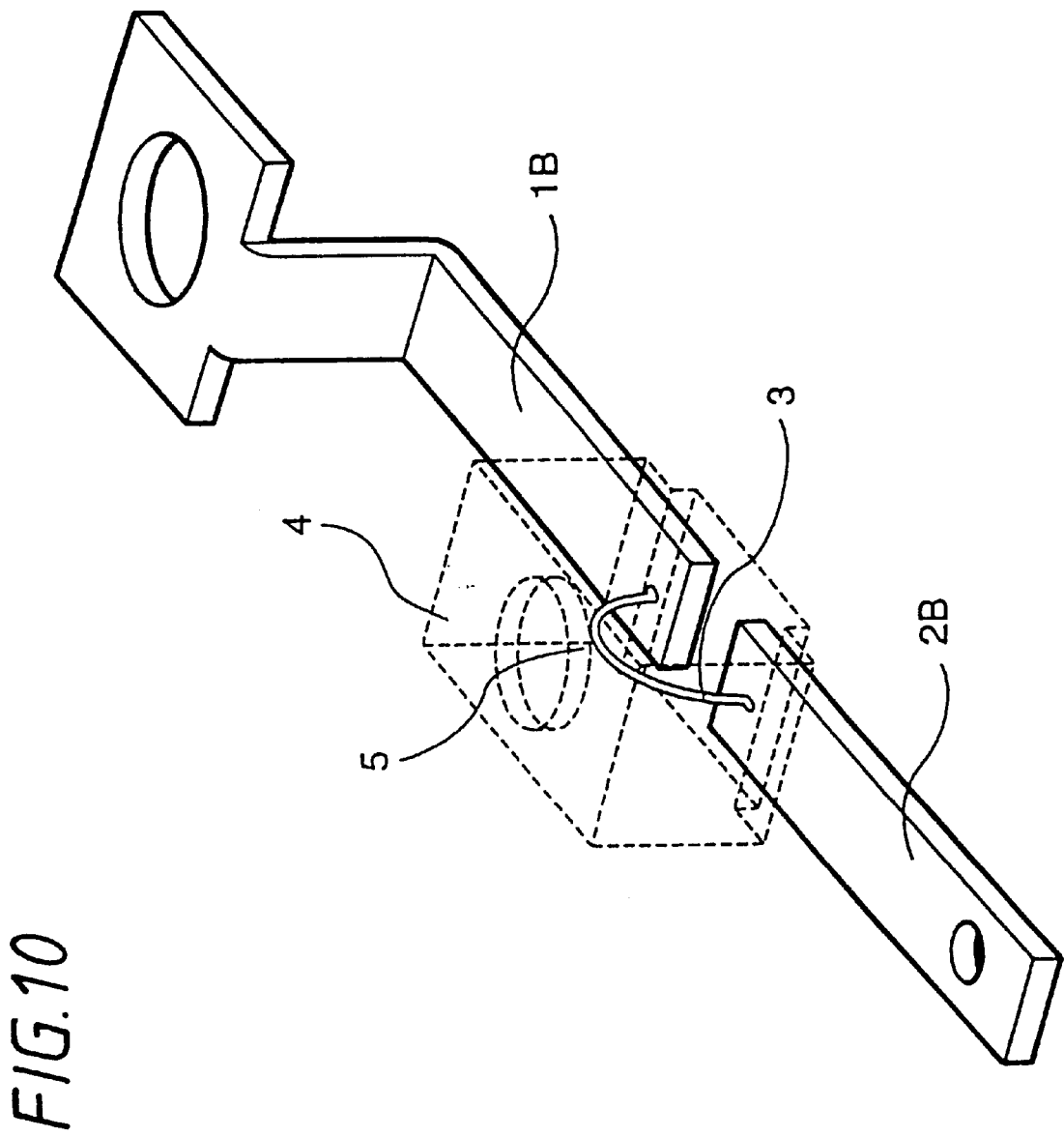
FIG. 10 is a schematic perspective view showing the construction of a third mode of embodiment of the excess current interrupting structure according to the invention.

A perspective view of FIG. 10 shows the construction of a third mode of embodiment of the excess current interrupting structure according to the present invention. In this mode of embodiment, electrode pieces 1B, 2B are used as a pair of electric conductors as shown in the same drawing, one of which is an electrode piece 1B of a terminal structure in which an electric conductor is drawn out by a suitably selected length, and the other of which is a non-terminal-carrying electrode piece 2B, and a conductor wire 3 is connected between the pair of electrode pieces 1B, 2B by wire bonding and then resin-sealed to form an excess current interrupting structure functioning in accordance with the above-mentioned first mode of embodiment.

Even in the excess current interrupting structure of this mode of embodiment, a thin coated layer of covering 5 is formed at the same time in a section in the vicinity of a path of the conductor wire 3 when a resin layer 4 is formed, so that the section in which the thin coated layer of covering 5 is formed is momentarily destroyed with a carbonized path as if cracks occurred in a fault, owing to thermal stress and a gas occurring due to an excess current flowing in the conductor wire 3 no matter whether the conductor wire 3 connected between the pair of electrode pieces 1B, 2B is melted by the excess current. Therefore, effects identical with those of the first mode of embodiment are obtained.

In order to manufacture the excess current interrupting structure of this mode of embodiment, sequently carried out are an electrode piece formation stage (1), a terminal structure processing stage (2), a wire bonding stage (3) and a resin molding stage (4), which are set by arranging the same from an upstream side of a production line toward a downstream side thereof with respect to a lead frame 13, and, after the resin molding stage (4) has been finished, frame cutting is done to obtain the excess current interrupting structure of FIG. 10.

Figure 12A:
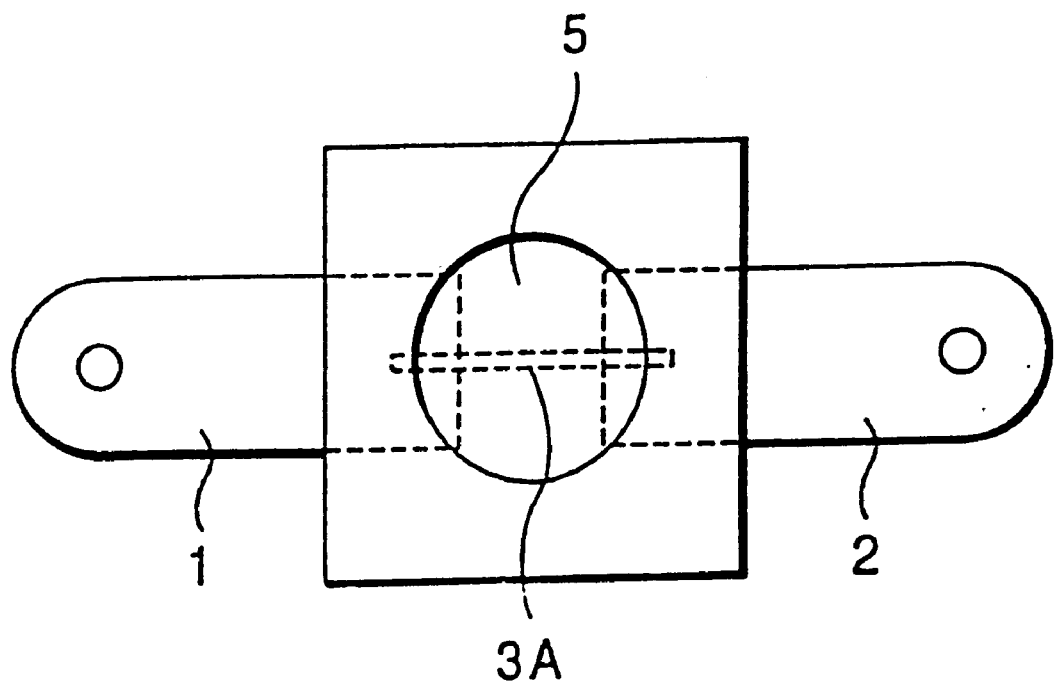
FIG. 12 is a drawing describing the construction of a fourth mode of embodiment of the excess current interrupting structure according to the invention.
Figure 12B:
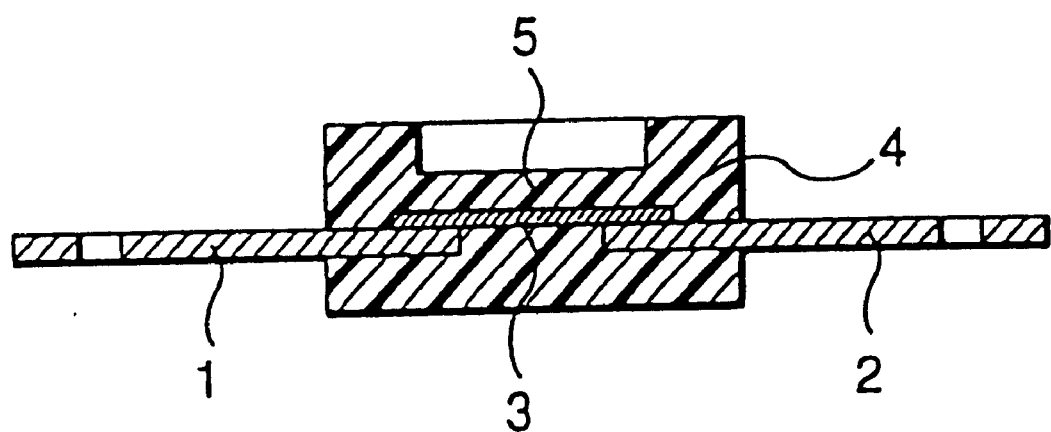

In the excess current interrupting structures of the above-mentioned modes of embodiments, the electric conductors are connected together by the conductor wire 3 of a curved section which is peculiar to a conductor wire to be wire-bonded but, in an excess current interrupting structure of a fourth mode of embodiment shown in a top view of FIG. 12(a) and a sectional view of FIG. 12(b), a pair of electrode pieces 1, 2 are connected together by a conductive wire rod 3A of a linear shape and then resin-sealed to form an excess current interrupting structure in accordance with the first mode of embodiment mentioned above. The wire rod and conductor foil which are identical with those of the above-mentioned conductor wire 3 can be applied to the conductive wire rod 3A.

Even in the excess current interrupting structure of this mode of embodiment, the thin coated layer of covering 5 is formed at the same time in a section in the vicinity of the path of the conductive wire rod 3A when the resin layer 4 is formed, so that the section in which the thin coated layer of covering 5 is formed is momentarily destroyed with the carbonized path as if cracks occurred in a fault, owing to thermal stress and a gas occurring due to an excess current flowing in the conductive wire rod 3A no matter whether the conductive wire rod 3A connected between the pair of electrode pieces 1, 2 is melted by the excess current or not. Therefore, effects identical with those of the above-mentioned mode of embodiment are obtained. In addition, since the linear conductive wire rod 3A is utilized, the structure as a whole can be made more compact.

Figure 13:
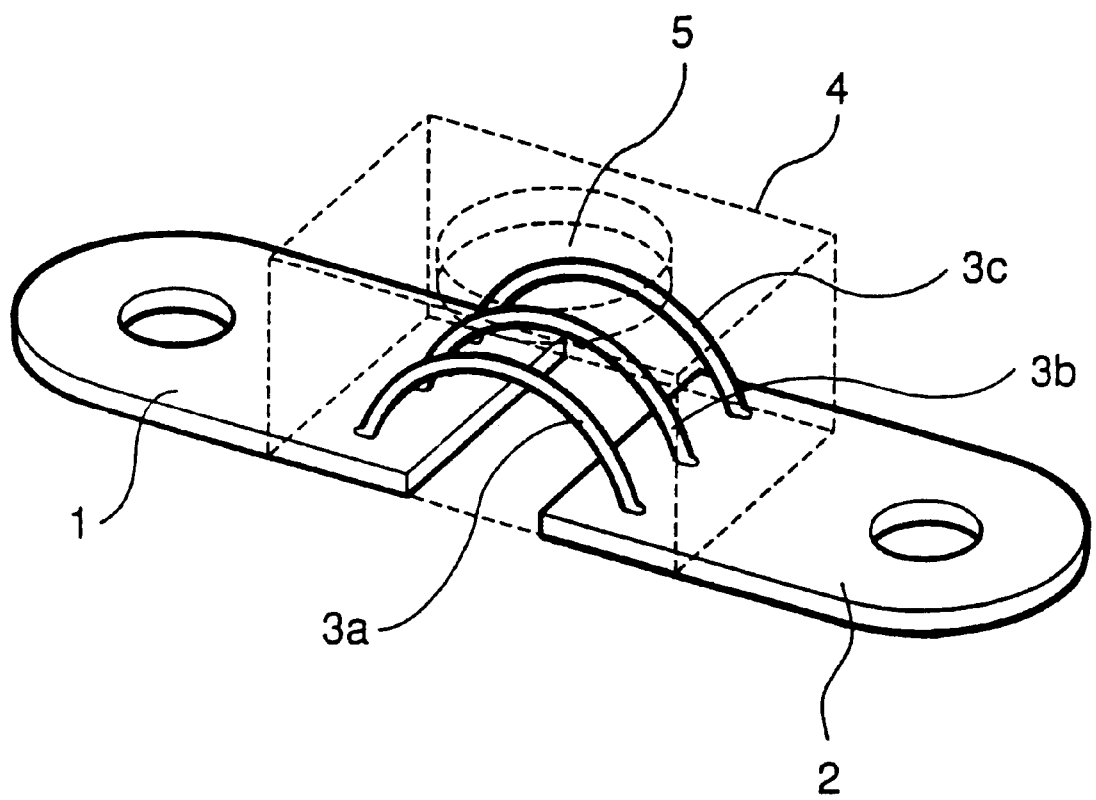
FIG. 13 is a schematic perspective view showing the construction of a fifth mode of embodiment of the excess current interrupting structure according to the invention.

As in the excess current interrupting structure of a fifth mode of embodiment shown in FIG. 13, it is possible to expand a heat source occurring when an excess current flows, and expand a destruction starting point, by connecting a plurality of conductor wires 3a–3c between a pair of electrode pieces 1, 2.

In this case, the expansion operation can be effected by reducing the diameter of the conductor wires in inverse proportion to the number thereof connected.

Figure 14:
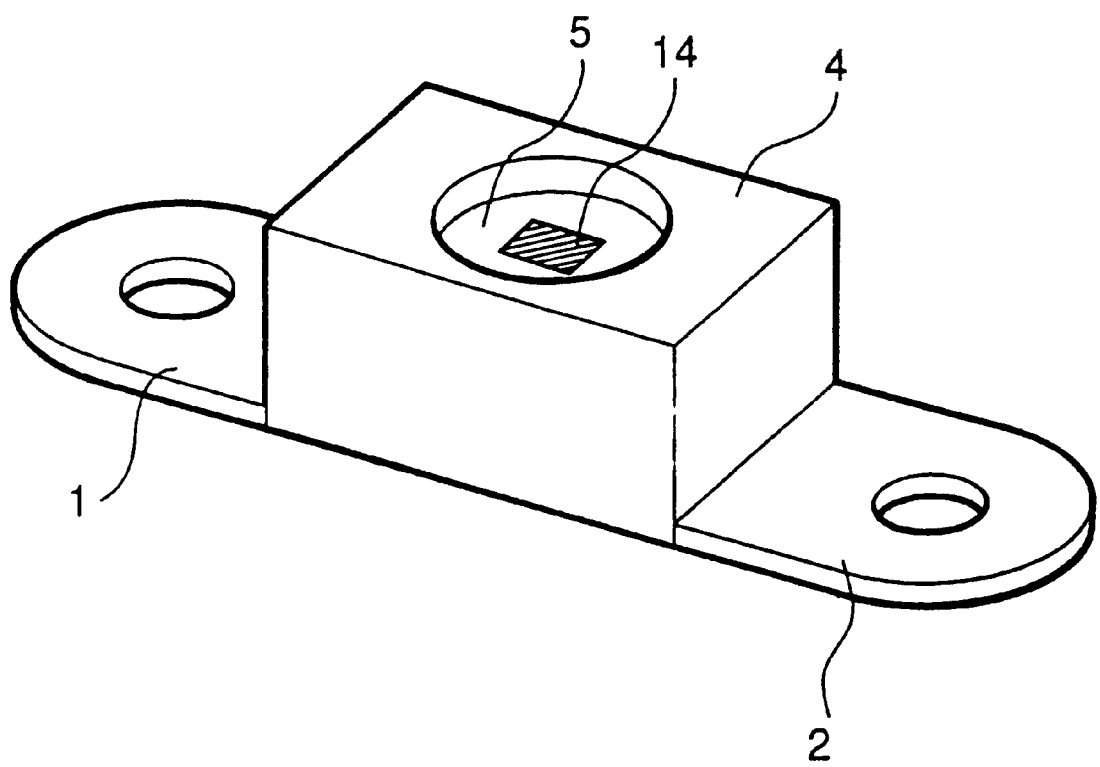
FIG. 14 A schematic perspective view showing the construction of a sixth mode of embodiment of the excess current interrupting structure according to the invention.

As in the excess current interrupting structure of a sixth mode of embodiment shown in FIG. 14, a structure in which a temperature sensing substance 14, such as a thermal tape is pasted on an outer surface of a thin coated layer of covering 5 can be employed. In this structure, when the thermal destruction of a section in which the thin coated layer of covering 5 is formed cannot be recognized visually from the outside, the occurrence of the destruction can be known by a change in color tone due to the sensing of a temperature done by the temperature sensing substance 14. The temperature sensing substance can also be formed into an embedded structure.

Figure 15:
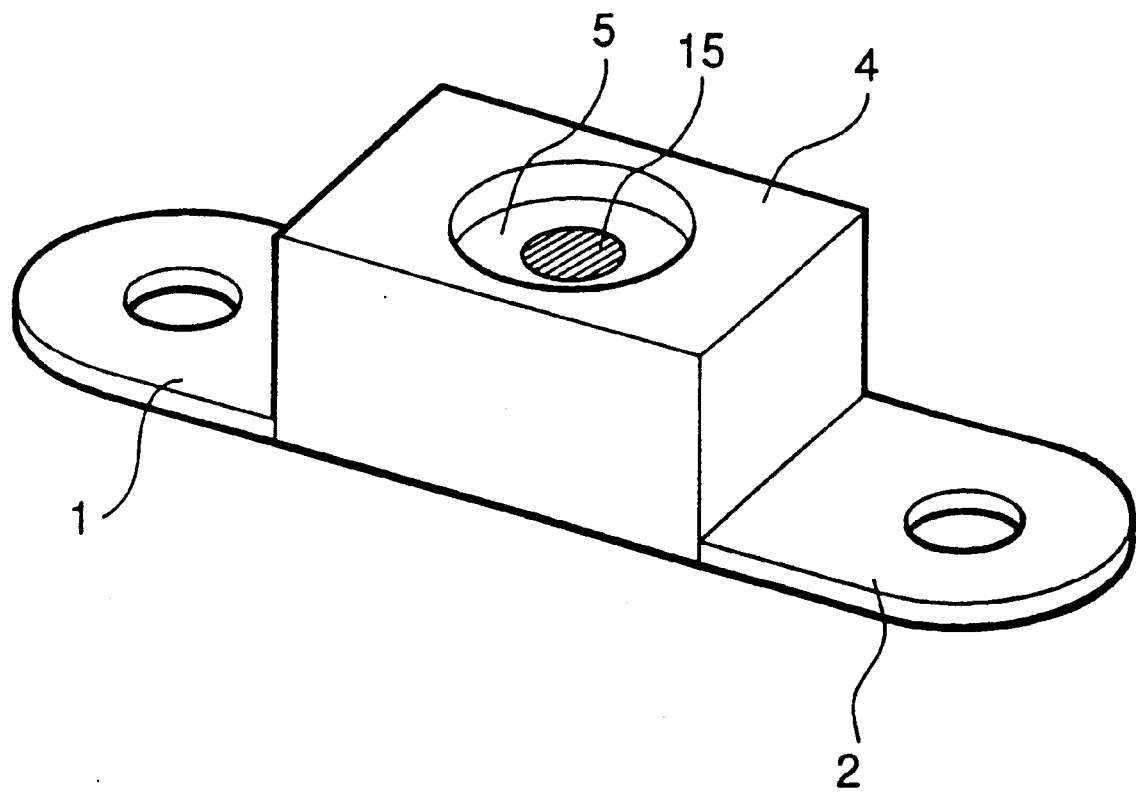
FIG. 15 is a schematic perspective view showing the construction of a seventh mode of embodiment of the excess current interrupting structure according to the invention.
Figure 16:
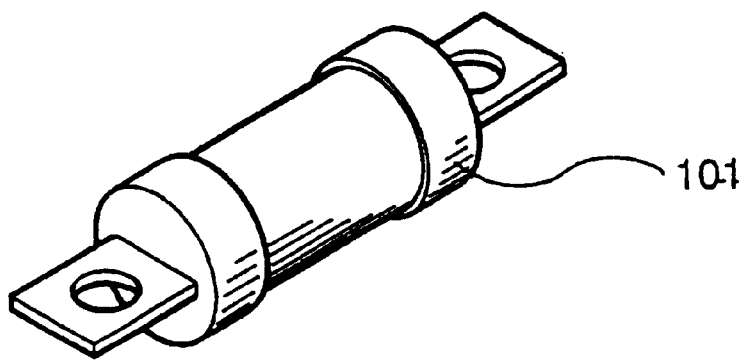
FIG. 16 is a perspective view showing an example of a related cartridge type fuse.
Figure 17:
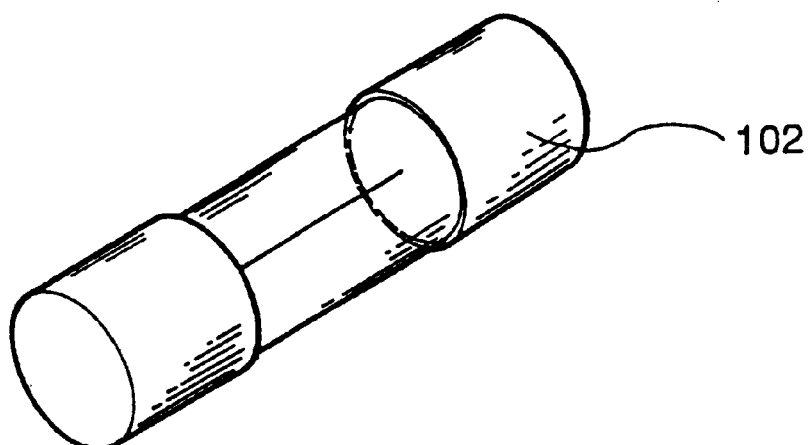
FIG. 17 is a perspective view showing an example of a related tubular fuse.

As in the excess current interrupting structure of a seventh mode of embodiment shown in FIG. 15, a structure in which a physical force sensing substance 15, such as a physical force sensitive paper is pasted on an outer surface of a thin coated layer of covering 5 can be employed. In this structure, when the thermal destruction of a section in which the thin coated layer of covering 5 is formed cannot be recognized visually from the outside, the occurrence of the destruction can be known by a change in color tone due to the sensing of a physical force done by the physical force sensing substance 15. The physical force sensing substance can also be formed into a embedded structure.

Since the excess current interrupting structure according to the present invention has the construction of the modes of embodiments described above, it can be used as a circuit part, and, when an excess current flows in an electric path to which the excess current interrupting structure is connected, the electric path can be shut off with a high responsibility.

As is clear from the above description, the present invention can provide a practical excess current interrupting structure in which a circumference of a conductive wire rod is covered with a resin, capable of shutting off with a high responsibility and a high reliability an electric path in which an excess current flows.

What is claimed is:

1. A method for manufacturing an excess current interrupting structure, comprising:

preparing a lead frame comprising a plurality of electrical conductors, wherein a pair of the electrical conductors is configured to face one another across a gap;

wire bonding a first electrically conductive wire between the pair of the electric conductors;

forming by resin molding a resin body between the pair of electrical conductors covering the first electrically conductive wire; and forming a recessed portion being formed on a side of the resin body to define a thin layer of resin over the first electrically conductive wire.

2. The method of manufacturing an excess current interrupting structure of claim 1, further comprising forming a second recessed portion over the first electrically conductive wire in a second side of the resin body.

3. The method of manufacturing an excess current interrupting structure of claim 1, further comprising forming a second recessed portion over the first electrically conductive wire in the recessed portion of the resin body.

4. The method of manufacturing an excess current interrupting structure of claim 1, further comprising connecting a second electrically conductive wire between the electrical conductors prior to forming the resin body covering the first electrically conductive wire.

5. The method of manufacturing an excess current interrupting structure of claim 1, wherein the electrically conductive wire is made from a metal selected from the group consisting of gold, copper and aluminum.

6. The method of manufacturing an excess current interrupting structure of claim 1, further comprising providing an abnormality indicator on the thin resin layer.

7. The method of manufacturing an excess current interrupting structure of claim 6, wherein the abnormality indicator comprises a temperature sensing substance.

8. The method of manufacturing an excess current interrupting structure of claim 6, wherein the abnormality indicator comprises a physical force sensing substance.

9. The method of manufacturing an excess current interrupting structure of claim 1, comprising configuring the electrical conductors is chosen so as to concentrate buildup of heat caused by the current flow in excess of a predetermined level on the first electrically conductive wire.

10. The method of manufacturing an excess current interrupting structure of claim 1, comprising configuring the electrical conductors in a shape according to surface mounting specifications.

11. The method of manufacturing an excess current interrupting structure of claim 1, wherein the forming of the resin body or the forming of the recessed portion is carried out using transfer molding.

12. The method of manufacturing an excess current interrupting structure of claim 1, wherein the preparing of the lead frame further comprises forming the outer shape of a case for the excess current interrupting structure.

* * * * *